(12) United States Patent
Lee

(10) Patent No.: US 7,230,561 B2
(45) Date of Patent: Jun. 12, 2007

(54) PROGRAMMABLE INTEGRATING RAMP GENERATOR AND METHOD OF OPERATING THE SAME

(75) Inventor: Yan Lee, Guildford (GB)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 11/044,532

(22) Filed: Jan. 27, 2005

(65) Prior Publication Data
US 2006/0164277 A1 Jul. 27, 2006

(51) Int. Cl.
*H03M 1/12* (2006.01)

(52) U.S. Cl. .................. 341/172; 341/155; 341/144

(58) Field of Classification Search ........... 341/150, 341/172, 120, 122, 118, 155
See application file for complete search history.

(56) References Cited

U.S. PATENT DOCUMENTS

| | | | | |
|---|---|---|---|---|
| 4,388,612 A | * | 6/1983 | Takagi et al. ............... 341/145 |
| 4,705,961 A | * | 11/1987 | Ainsworth et al. ......... 327/135 |
| 5,101,206 A | * | 3/1992 | Riedel ......................... 341/156 |
| 5,283,578 A | * | 2/1994 | Ribner et al. ............... 341/143 |
| 5,719,528 A | * | 2/1998 | Rasmussen et al. ......... 330/10 |
| 5,760,623 A | * | 6/1998 | Hastings ...................... 327/137 |
| 5,774,390 A | * | 6/1998 | Tailliet ......................... 708/801 |
| 5,995,036 A | * | 11/1999 | Nise et al. ................... 341/172 |
| 6,066,943 A | * | 5/2000 | Hastings et al. ............ 323/285 |
| 6,144,331 A | * | 11/2000 | Jiang ........................... 341/172 |
| 6,456,220 B1 | * | 9/2002 | Leung et al. ................ 341/155 |
| 6,545,624 B2 | * | 4/2003 | Lee et al. .................... 341/155 |
| 6,940,345 B2 | * | 9/2005 | Nair et al. ..................... 330/51 |
| 2003/0071666 A1 | * | 4/2003 | Bailey ......................... 327/131 |
| 2006/0166277 A1 | * | 7/2006 | Karumanchi et al. ........ 435/7.1 |
| 2006/0208938 A1 | * | 9/2006 | Fiorenza et al. ............ 341/172 |

FOREIGN PATENT DOCUMENTS

EP 0 205 140 A3 12/1986

OTHER PUBLICATIONS

Microelectric Circuits, 3rd Edition; Adel S. Sedra and Kenneth C. Smith; ISBN 0-03-051648-X; 1991; Saunders College Publishing; pp. 738-753, no month.

* cited by examiner

*Primary Examiner*—Linh V. Nguyen
(74) *Attorney, Agent, or Firm*—Jones Day; Edward L. Pencoske

(57) ABSTRACT

A ramp generator for an analog-to-digital converter comprises an array of capacitors each controlled by a switch responsive to one or more control signals and operable to connect/disconnect one or more of the capacitors relative to the array and a current source operable to charge at least one of the capacitors. A method for operating a ramp generator having an array of capacitors comprises resetting the ramp generator, enabling a current generator to charge at least one capacitor in the switched capacitor array, and controlling the state of one or more switches, wherein the switches are operable to connect and disconnect one or more of the capacitors relative to the array. The output of the ramp generator having a plurality of programmable breakpoints. Because of the rules governing abstracts, this abstract should not be used to construe the claims.

43 Claims, 12 Drawing Sheets

PROGRAMMABLE INTEGRATING RAMP GENERATOR AND METHOD OF OPERATING THE SAME

BACKGROUND

The present invention relates generally to a ramp generator for analog-to-digital (A/D) conversion applications and more particularly to a programmable non-linear ramp generator which utilizes a switched-capacitor array for A/D conversion applications.

An analog-to-digital converter (ADC) may be used to translate an analog signal (e.g., a current or voltage produced by a sensor) into a digital signal that can be used by another device (for example, a microprocessor). In complimentary metal-oxide semiconductor (CMOS) imaging applications, for example, ADCs are increasingly being used as the preferred means for converting charge captured by CMOS sensors into a digital read-out.

Several types of ADCs are currently used, each type differing in the technique utilized to complete the A/D conversion. For example, feed-back type converters, dual-slope converters, flash converters, charge-redistribution converters, and digital ramp converters are known in the art.

A feedback-type converter typically employs a comparator, an up-down counter, and a digital-to-analog converter (DAC). FIG. 8 is a simplified diagram of a prior art feedback-type converter. An analog signal ($V_A$) is fed to one input of the comparator. The output of the comparator is connected to the input of the counter. The outputs of the counter are connected to the inputs of the DAC and the output of the DAC ($V_o$) is fed back to another of the comparator's inputs. The counter also receives a clock signal. Whenever the output of the comparator is high (i.e., when the difference between $V_A$ and $V_o$ is positive), the counter counts the pulses of the clock signal and the output of the counter increases. This in turn causes the voltage $V_o$ to rise. When $V_o$ equals $V_A$, the output of the comparator goes low and the counter is stopped. At this point, the counter's output represents the digital equivalent of the analog signal voltage.

FIG. 9 is a simplified diagram of a prior art dual-slope converter. A dual-slope converter typically functions in two stages. In the first stage, an analog signal ($V_A$) is applied for a fixed time period to charge the capacitor $C_1$ and produce a voltage $v_1$. The voltage $v_1$ typically has a variable slope during this first stage. In the second stage, a reference signal ($V_{ref}$) is applied for a variable time period and allows the voltage $v_1$ to discharge from the capacitor $C_1$. The voltage $v_1$ typically has a constant slope during the second stage. Control logic provides signals to control switching between the first and second stages. The control logic also provides control signals to a counter which is used to count pulses from a fixed-frequency clock. The count recorded by the counter during the second stage represents the digital equivalent of the analog voltage applied during stage 1.

FIG. 10 is a simplified diagram of a prior art flash converter. A flash converter typically uses $2^{N-1}$ comparators to simultaneously compare the analog input signal level ($V_A$) to each of the $2^{N-1}$ possible quantization levels. A 4-bit DAC, for example, uses sixteen comparators to convert an analog signal into a 4-bit digital word. The DAC includes a logic block that encodes the output from each of the sixteen comparators into the N-bits of the digital word. For instance, an analog input signal between 0 and 5V may be represented using the 4-bit binary number. The 4-bit binary number may represent $2^4$ (i.e., 16) different values (i.e., from 0 to 15). The resolution of the conversion will thus be 5V/15=⅓V. Accordingly, the first quantization level (e.g., for bit 0000) corresponds to an analog signal of 0V, the second quantization level (e.g., for bit 0001) corresponds to an analog signal of ⅓V, the third quantization level (e.g., for bit 0010) corresponds to an analog signal of ⅔V, and so on. This pattern is repeated for each of the sixteen quantization levels (i.e., up to bit 1111, which corresponds to an analog signal of 5V).

FIG. 11 is a simplified diagram of a prior art charge-redistribution converter. A charge-redistribution converter typically uses a capacitor array, a comparator, switches, and control logic, among others. During operation, a voltage ($v_A$) proportional to the analog input voltage ($V_A$) is first stored across the capacitors in the capacitor array by connecting one side of the array to $V_A$ and the other side of the array (e.g., the side also connected to an input of the comparator) to ground. The plates of capacitors connected to the input terminal of the comparator are then open-circuited (e.g., switch S2 is opened) while the plates of the capacitors on the other side of the capacitor array are switched to ground (e.g., SC1, SC2, ... SC6 are connected to ground). Next, the charge stored by the capacitors is redistributed by switching the individual capacitors to the reference voltage and/or ground until the voltage across the plates of the capacitors reaches zero. The final position of the switches (i.e., SC1, SC2, ... SC6) represents the output of the digital word. For example, a switch that is connected to ground in its final position represents a "0"; whereas a switch connected to the reference voltage source in its final position represents a "1".

A digital ramp converter typically includes a comparator and a ramp generator. An analog signal is fed to one input of the comparator and the output of the ramp generator is fed to another input of the comparator. FIG. 12 is a simplified circuit diagram of a ramp generator 100 and a comparator 102 according to the prior art. FIG. 13 is a timing diagram for a ramp generator 100 of FIG. 12 according to the prior art. The ramp generator 100 is comprised of a plurality of identical switching current sources 101(1), 101(2), 101(3), ... 101(n), a capacitor 103, and reset switch $S_0$. Operation begins by placing the ramp generator 100 into the reset mode by opening switches $S_1, S_2, S_3, \ldots S_n$ and closing switch $S_0$. Referring to FIG. 13, at $t_o$, signal $T_o$ goes high and signals $T_1$ through $T_n$ remain low (which keep switches 101(1) through 101(n) open). When signal $T_0$ goes high, switch $S_0$ is closed and the output of the ramp generator 100 is connected to the voltage source $V_{ref}$ (i.e., $V_{ramp}$ equals $V_{ref}$).

At $t_1$, signal $T_0$ goes low opening switch $S_0$ and signal $T_1$ goes high closing switch $S_1$ and enabling current source 101(1). Current source 101(1) charges capacitor 103 and the output of the ramp generator (i.e., $V_{ramp}$) begins to rise above $V_{ref}$ at a constant rate which is proportional to the value of the current source 101(1). At the first break point, $t_2$, signal $T_2$ goes high closing switch $S_2$ and enabling current source 101(2). The slew rate of the ramp generator output is now doubled. At the next break point, $t_3$, signal $T_3$ goes high closing switch $S_3$ and enabling current source 101(3). This increases the slew rate of the ramp generator again. The final break point occurs at $t_n$ when the last current source 101(n) is enabled by signal $T_n$ closing switch $S_n$.

Returning to FIG. 12, the output of the ramp generator (i.e., $V_{ramp}$) is supplied to an input terminal comparator 102. Comparator 102 compares $V_{ramp}$ with an analog signal $V_a$, which is supplied to another input terminal of the comparator 102. If $V_a$ is greater than $V_{ramp}$, the output of comparator 102 is high and the ramp generator 100 continues to increase $V_{ramp}$. If $V_{ramp}$ is greater than $V_a$, the output of the comparator 102 goes low and the ramp generator 100 stops increasing $V_{ramp}$. An ADC code counter (not shown) is used to stop the ramp and to determine the ADC code.

One major drawback inherent to prior art ramp generators 100, however, is the difficulty encountered in trying to manufacture matched current generators. Due to the manufacturing techniques used to construct the transistors comprising the current sources, a current source can typically only be matched within approximately 2% of another current source. The inability to accurately match current source leads to inaccurate conversion of the analog signal.

As discussed above, ADCs are increasingly being used as the preferred means for converting charge captured by CMOS sensors into a digital read-out in CMOS imaging applications. The error inherent in the prior art ADCs adversely effects the results obtained in the CMOS imaging applications.

Accordingly, a need exists for a modulating ramp A/D converter which overcomes these problems and which overcomes other limitations inherent in the prior art. More specifically, a need exists for a modulating ramp A/D converter which can be used in CMOS imaging applications, for example, to convert charge captured by CMOS sensors into a digital read-out.

SUMMARY

One aspect of the invention relates to a ramp generator for an analog-to-digital converter comprising an array of capacitors each controlled by a switch operable to connect/disconnect one or more of the capacitors within the array, wherein each of the switches is responsive to one or more control signals and a current source operable to charge at least one of the plurality of capacitors within the array.

Another aspect of the invention relates to a ramp generator comprising first and second operational amplifiers. The first operational amplifier has an input for receiving a first reference voltage, an input connected to at least one of a first current source, a first bias current source, and a first side of a first array of capacitors each controlled by a switch, and an output connected to a second side of the first array. The second operational amplifier has an input for receiving a second reference voltage, an input connected to at least one of a second current source, a second bias current source, and a first side of a second array of capacitors each controlled by a switch, and an output connected to a second side of the second array.

Another aspect of the invention relates to a method for operating a ramp generator having an array of capacitors each controlled by a switch comprising resetting the ramp generator, enabling a current generator, the current generator charging at least one capacitor within the array, and controlling the state of one or more switches, wherein the switches are operable to connect/disconnect one or more capacitors within the array.

Another aspect of the invention relates to an analog-to-digital converter comprising a comparator and a ramp generator. The ramp generator is comprised of an array of capacitors each controlled by a switch operable to connect/disconnect one or more of a plurality of capacitors within the array, wherein the plurality of switches are responsive to one or more control signals and a current source operable to charge at least one of the plurality of capacitors within the array.

Another aspect of the invention relates to a method for generating a ramp output using a ramp generator having an array of capacitors each controlled by a switch, the method comprising resetting the ramp output to a constant level, changing the ramp output at a rate of change corresponding to a least significant bit, and changing the ramp output at another rate of change corresponding to a another least significant bit.

Another aspect of the invention relates to an analog-to-digital converter comprising a ramp generator and a conversion circuit. The ramp generator comprises first and second operational amplifiers, the first operational amplifier having an input for receiving a first reference voltage, an input connected to at least one of a first current source, a first bias current source, and a first side of a first array of capacitors each controlled by a switch, and an output connected to a second side of the first array, the output operable to carry a falling ramp signal, and the second operational amplifier having an input for receiving a second reference voltage, an input connected to at least one of a second current source, a second bias current source, and a first side of a second array of capacitors each controlled by a switch, and an output connected to a second side of the second array, the output operable to carry a rising ramp signal. The conversion circuit comprises a differential amplifier operable to produce an amplified differential signal responsive to two or more input signals, a comparator operable to compare the amplified differential signal to the difference of the falling ramp signal and the rising ramp signal, and a logic circuit operable to produce a digital output responsive to the comparison completed by the comparator.

BRIEF DESCRIPTION OF THE DRAWINGS

To enable the present invention to be easily understood and readily practiced, the present invention will now be described for purposes of illustration and not limitation, in connection with the following figures wherein.

DETAILED DESCRIPTION

The detailed description sets forth specific embodiments which are described in sufficient detail to enable those skilled in the art to practice the present invention. It should be apparent to those skilled in the art that other embodiments may be utilized, and that logical, mechanical, and electrical changes may be made, while remaining within the scope of the present invention. The following detailed description is, therefore, not to be taken in a limiting sense, and the scope of the invention is defined only by the appended claims.

Figure 1:
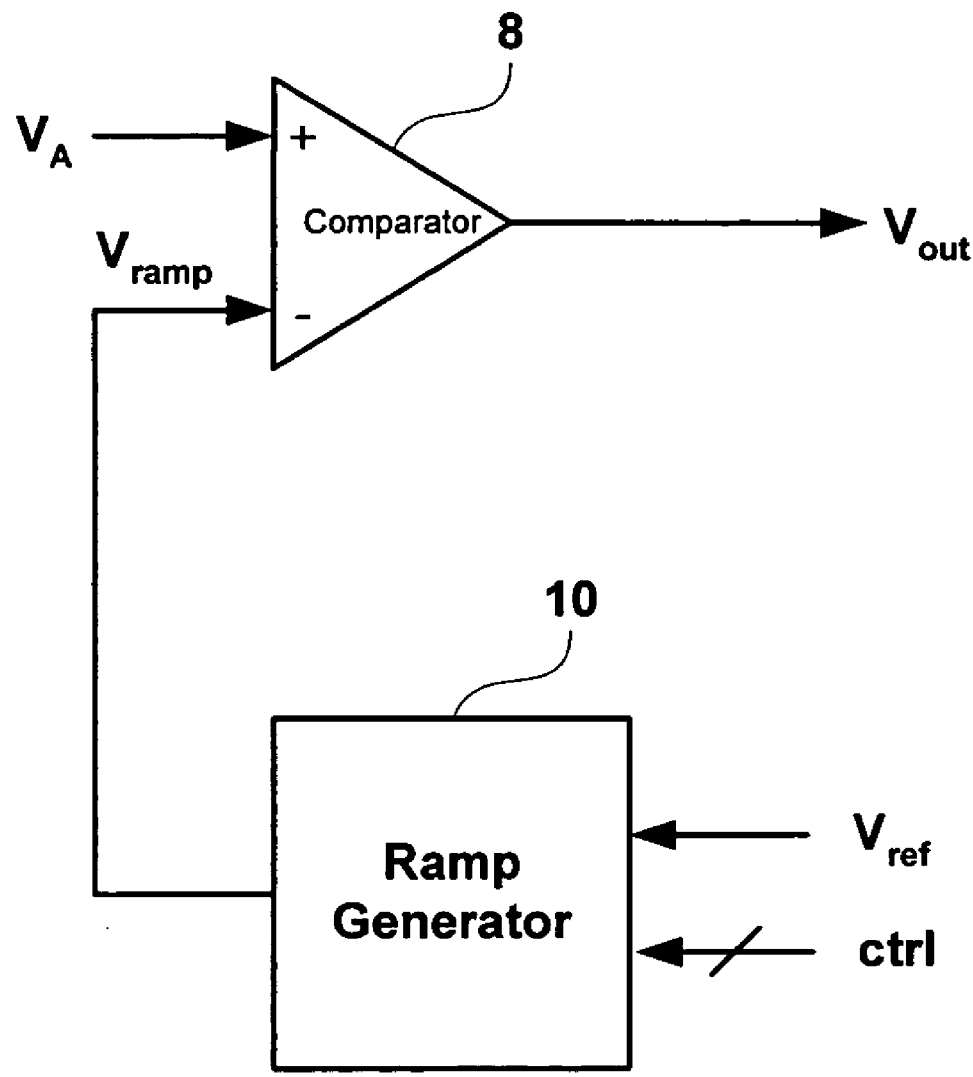
FIG. 1 is a simplified diagram of an analog-to-digital converter according to one embodiment.

FIG. 1 is a simplified diagram of an analog-to-digital converter (ADC) 5 according to one embodiment. ADC 5 includes a comparator 8 and a ramp generator 10. Comparator 8 receives an analog signal ($V_A$) at a first input and the ramp voltage ($V_{ramp}$) from the output of the ramp generator 10 at a second input. The ramp generator 10 utilizes an array of capacitors to produce the output signal $V_{ramp}$ in response to a reference voltage ($V_{ref}$) and control signals (ctrl), among others.

In operation, the ramp generator 10 is first reset such that $V_{ramp}$ is equal to $V_{ref}$. The comparator 8 compares $V_A$ to $V_{ramp}$. If $V_A$ is greater than $V_{ramp}$, the output of the comparator 8 ($V_{out}$) is high and the control signals (ctrl) cause the ramp generator 10 to increase $V_{ramp}$. If $V_{ramp}$ is greater than $V_A$, $V_{out}$ goes low and the control signals (ctrl) cause the ramp generator 8 to stop increasing $V_{ramp}$. The digital equivalent of the input signal $V_A$ may be determined from the ramp generator's 10 settings at the time that $V_{out}$ goes low.

Figure 2:
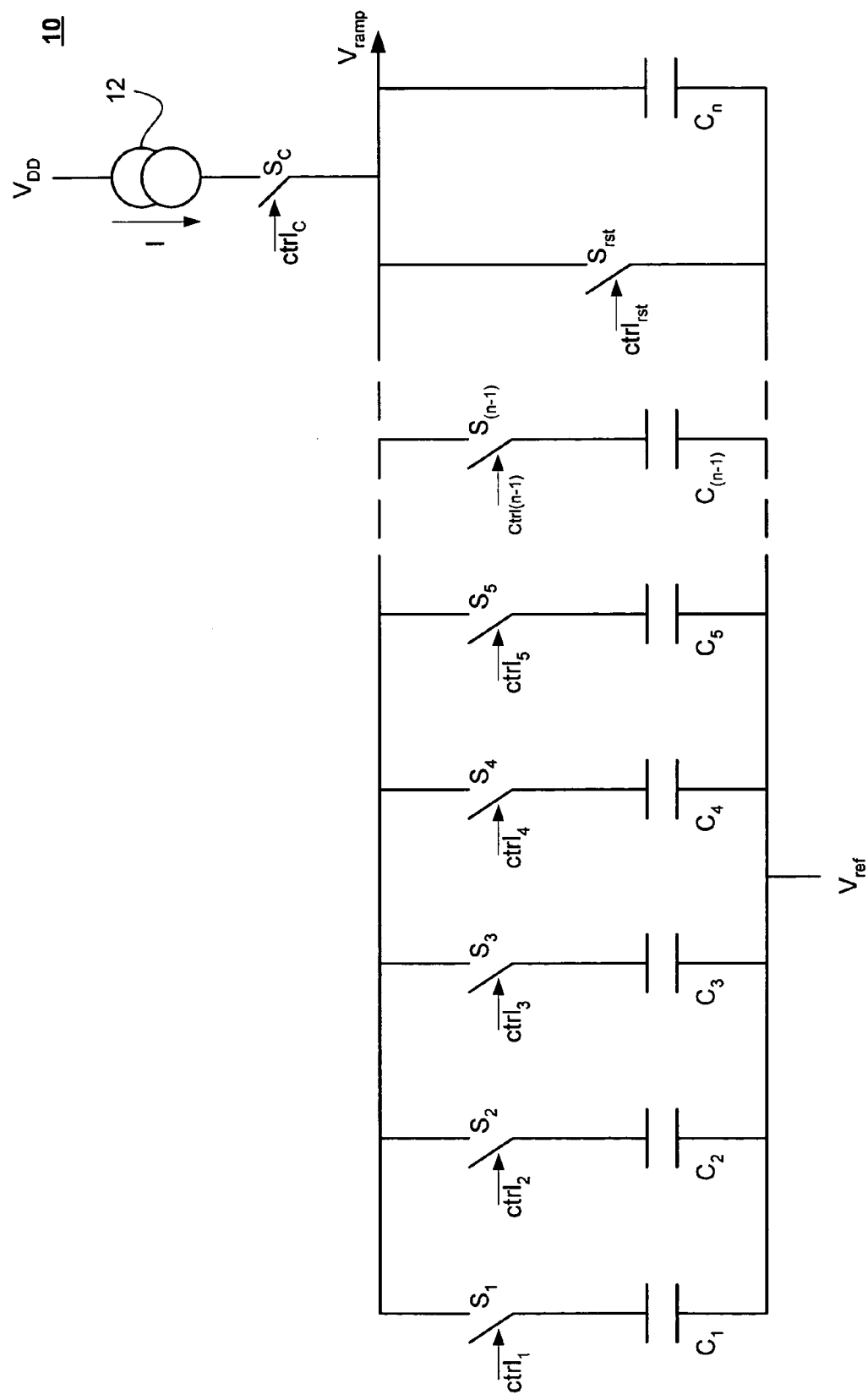
FIG. 2 is a simplified diagram of the ramp generator of FIG. 1 according to one embodiment.

FIG. 2 is a simplified diagram of the ramp generator 10 of FIG. 1 according to one embodiment. Ramp generator 10 includes an array of capacitors ($C_1, C_2, C_3, \ldots C_{n-1}$) each controlled by an associated switch ($S_1, S_2, S_3, \ldots S_{n-1}$). Each switch is responsive to a corresponding control signal ($ctrl_1$, $ctrl_2$, $ctrl_3$, ... $ctrl_{n-1}$). The ramp generator 10 may also include a reset switch ($S_{rst}$) responsive to a reset control signal ($crtl_{rst}$), a capacitor $C_n$ (which in the current embodiment does not include a corresponding switch), and a current source 12. The current source 12 includes a corresponding switch ($S_C$) which is responsive to a control signal ($ctrl_C$). The switch $S_C$ enables/disables (e.g., connects/disconnects) the current source 12 relative to the array, reset switch $S_{rst}$, and capacitor $C_n$.

Figure 12:
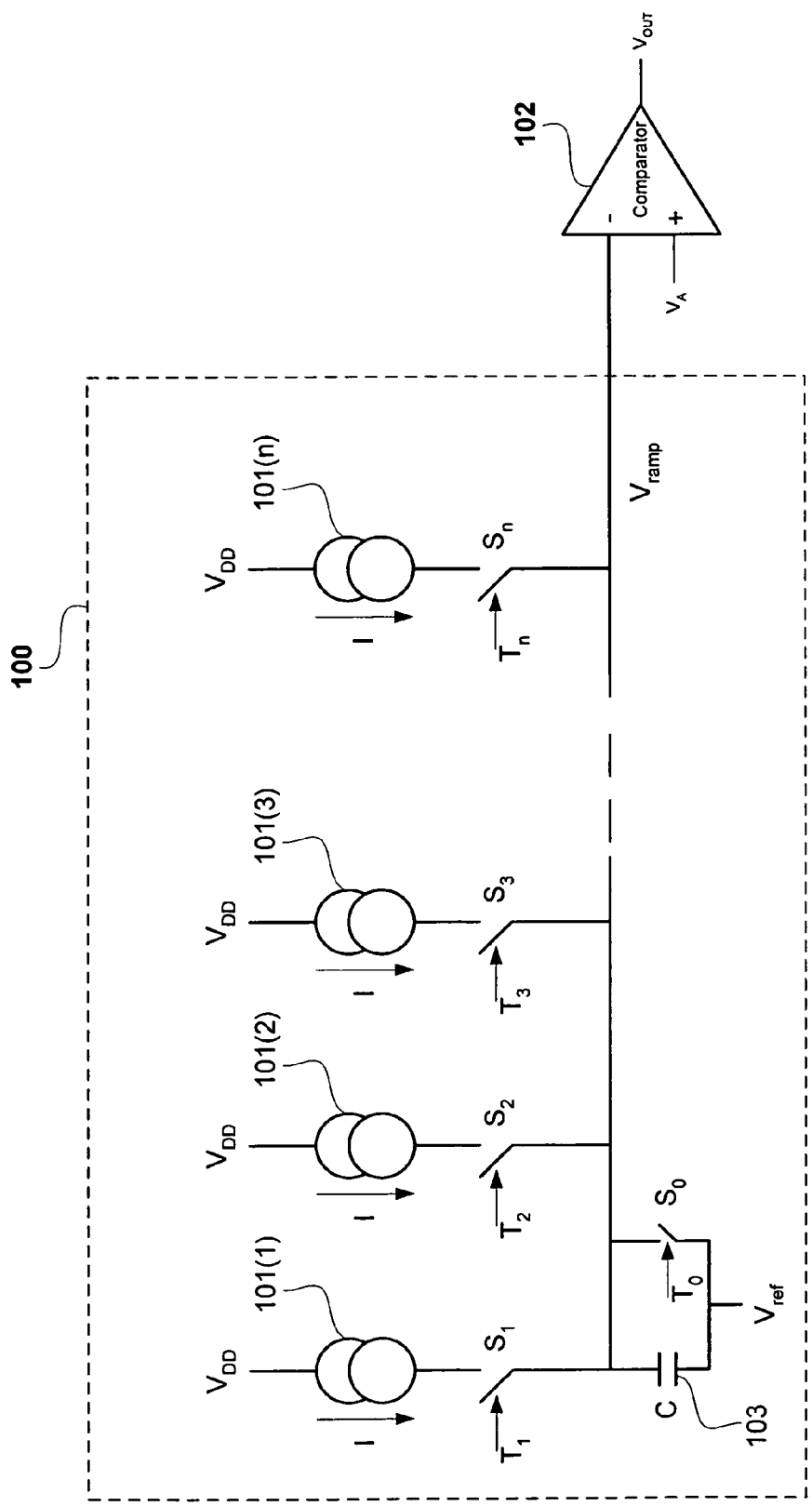
FIG. 12 is a simplified diagram of a ramp generator and comparator for a digital ramp analog-to-digital converter according to the prior art.
Figure 13:
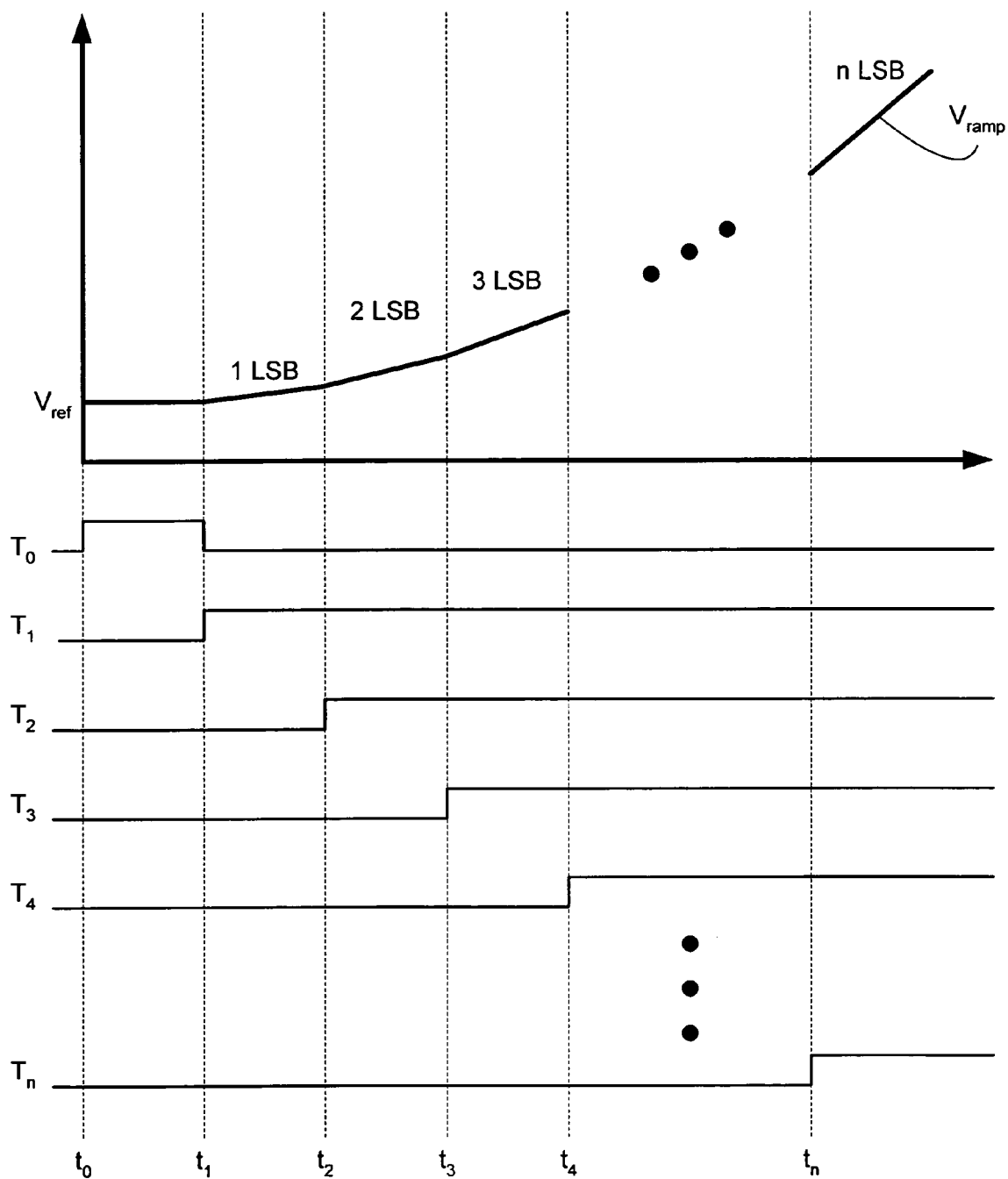
FIG. 13 is a timing diagram for the ramp generator of FIG. 12 according to the prior art.

In the current embodiment, the capacitors ($C_1, C_2, C_3, \ldots C_{n-1}, C_n$) are matched. Using the current manufacturing techniques, the capacitors ($C_1, C_2, C_3, \ldots C_{n-1}, C_n$) can be matched within approximately 0.05% of each other. Accordingly, an ADC incorporating the ramp generator 10 illustrated in FIG. 2 is more accurate than an ADC converter that incorporates prior art ramp generators (such as that shown in FIG. 12). It should be apparent to one skilled in the art that improved manufacturing techniques may lead to improved matching of the capacitors while remaining within the scope of the present invention.

Figure 3:
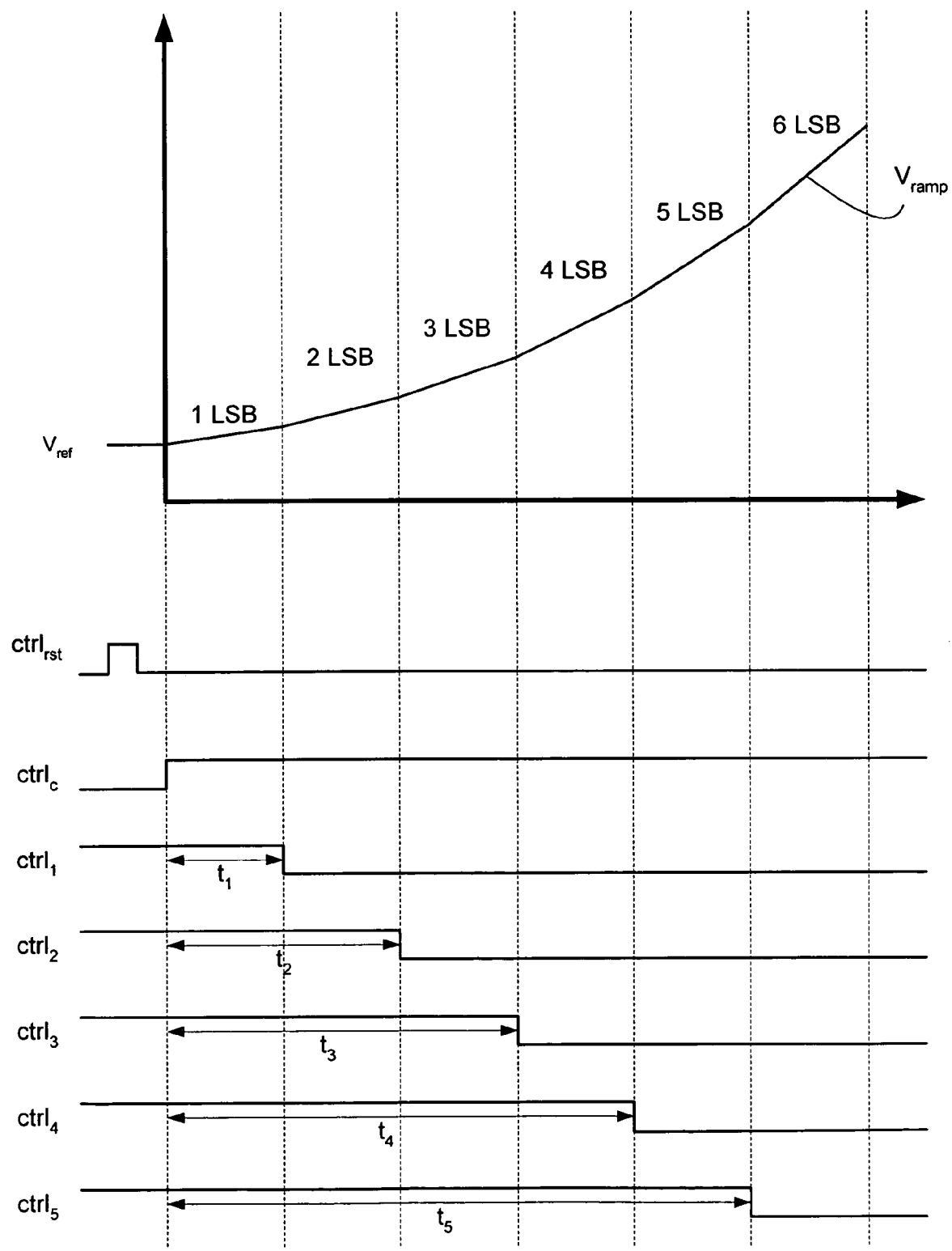
FIG. 3 is a timing diagram for the ramp generator of FIG. 2 according to one embodiment.

FIG. 3 is a timing diagram for the ramp generator 10 of FIG. 2 according to one embodiment. Operation begins when the ramp generator 10 is reset by disabling the current source 12 and activating the reset switch $S_{rst}$. Referring to FIG. 3, the ramp generator is reset when control signal $ctrl_C$ is low (thus opening switch $S_C$ and disabling current source 12) and control signal $ctrl_{rst}$ is pulsed high (thus closing switch $S_{rst}$). In the current embodiment, the control signals $ctrl_1, ctrl_2, ctrl_3, \ldots ctrl_{n-1}$ are all high at this time, thus capacitors ($C_1, C_2, C_3, \ldots C_{n-1}$) are connected across the array. However, when switch $S_{rst}$ is closed, the ramp generator output ($V_{ramp}$) is directly connected to $V_{ref}$ such that the capacitors ($C_1, C_2, C_3, \ldots C_{n-1}, C_n$) are effectively short circuited.

After the ramp generator 10 is reset, control signal $ctrl_{rst}$ goes low opening switch $S_{rst}$. Control signal $ctrl_C$ then goes high closing switch $S_C$ and enabling the current source 12. Current I flows from the current source 12 charging the capacitors ($C_1, C_2, C_3, \ldots C_{n-1}, C_n$) and causing $V_{ramp}$ to rise at a constant rate, for example, as illustrated as the 1LSB (i.e., least significant bit) portion of the $V_{ramp}$ curve in FIG. 3. The slope of the 1LSB portion of the $V_{ramp}$ curve can be defined as: $V_{ramp}=I*t_1/C_T$, where $C_T=C_1+C_2+C_3+\ldots C_{n-1}+C_n$, and $C_1=C_T/2$; $C_1+C_2=2*C_T/3$; $C_1+C_2+C_3=3*C_T/4$, etc.

After $t_1$ seconds, control signal $ctrl_1$ goes low opening switch $S_1$ and disconnecting capacitor $C_1$ from the capacitor array. This changes the slope of the $V_{ramp}$ curve at the breakpoint between the 1LSB and 2LSB portions of the $V_{ramp}$ curve shown in FIG. 3. The slope of the 2LSB portion of the $V_{ramp}$ curve can be defined as $V_{ramp}=I*(t_2-t_1)/(C_T-C_1)$ or $2I*(t_2-t_1)/C_T$.

After $t_2$ seconds, control signal $ctrl_2$ goes low opening switch $S_2$ and disconnecting capacitor $C_2$ from the capacitor array. This changes the slope of the $V_{ramp}$ curve at the breakpoint between the 2LSB and 3LSB portions of the $V_{ramp}$ curve shown in FIG. 3. The slope of the 3LSB portion of the $V_{ramp}$ curve can be defined as $V_{ramp}=I*(t_3-t_2)/(C_T-C_1-C_2)$ or $3I*(t_3-t_2)/C_T$.

At each break point, a capacitor is disconnected from the capacitor array changing the slope of the $V_{ramp}$ curve. The remaining slopes may be defined in a manner similar to that discussed above, for example, the slope of the nLSB can be defined as $V_{ramp}=I*(t_n-t_{n-1})/(C_n)$ or $nI*(t_n-t_{n-1})/C_T$.

In the current embodiment, the ramp generator output curve has a linear portion and a compressed portion. The linear portion of the ramp may be defined as $V_{ramp}=V_{ref}+(I*t)/C_T$. The compressed portion includes a plurality of discrete segments. Each segment is defined by one or more programmable breakpoints. The location of the breakpoints may be programmed by setting the time intervals $t_1, t_2, t_3, \ldots t_{n-1}$ as desired. The compressed portion of the ramp can be defined as $V_{ramp}=V_{ref}+(I*t_1)/C_T+2I*(t_2-t_1)/C_T+3I*(t_3-t_2)/C_T+\ldots+nI*(t_n-t_{n-1})/C_T$.

Figure 4:
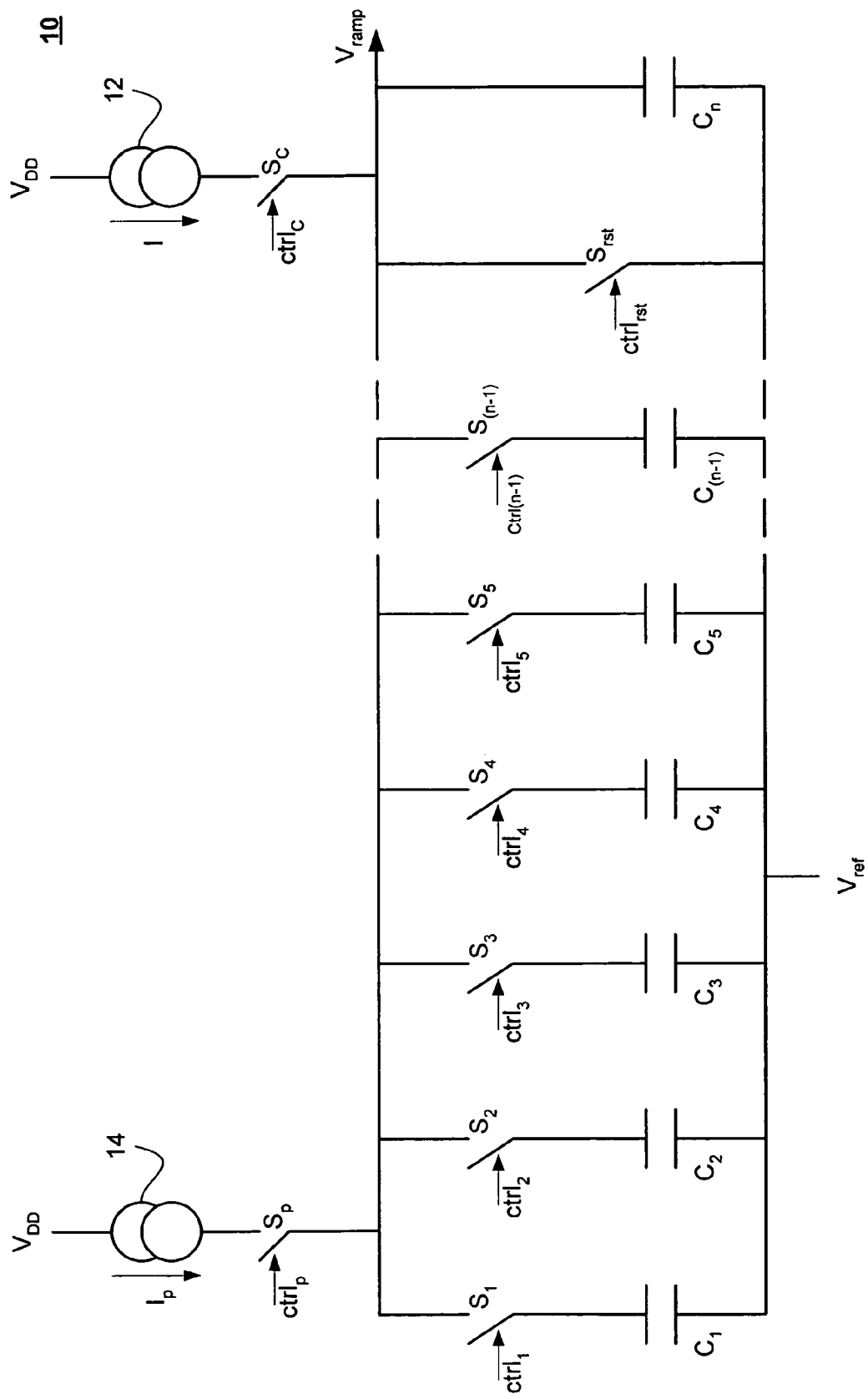
FIG. 4 is a simplified diagram of the ramp generator of FIG. 1 according to an alternative embodiment.

FIG. 4 is a simplified diagram of the ramp generator 10 of FIG. 1 according to an alternative embodiment. As discussed above in conjunction with FIG. 2, the ramp generator 10 of the alternative embodiment includes an array of capacitors ($C_1, C_2, C_3, \ldots C_{n-1}$) and associated switches ($S_1, S_2, S_3, \ldots S_{n-1}$). Each switch is responsive to a corresponding control signal ($ctrl_1, ctrl_2, ctrl_3, \ldots ctrl_{n-1}$). The ramp generator 10 of the alternative embodiment may also include a reset switch ($S_{rst}$) responsive to a reset control signal ($crtl_{rst}$), a capacitor $C_n$ (which does not include a corresponding-switch), and a current source 12. The current source 12 includes a corresponding switch ($S_C$) which is responsive to a control signal ($ctrl_C$). The switch $S_C$ enables/disables (e.g., connects/disconnects) the current source 12 relative to the array, reset switch $S_{rst}$, and capacitor $C_n$.

In the current embodiment, the capacitors ($C_1, C_2, C_3, \ldots C_{n-1}, C_n$) are matched. Using the current manufacturing techniques, the capacitors ($C_1, C_2, C_3, \ldots C_{n-1}, C_n$) can be matched within approximately 0.05% of each other. Accordingly, an ADC incorporating the ramp generator 10 illustrated in FIG. 4 is more accurate than an ADC converter that incorporates prior art ramp generators (such as that shown in FIG. 12). It should be apparent to one skilled in the art that improved manufacturing techniques may lead to improved matching of the capacitors while remaining within the scope of the present invention.

The ramp generator 10 illustrated in FIG. 4 also includes a second current source 14. The current source 14 includes a corresponding switch ($S_p$) which is responsive to a control signal ($ctrl_p$). The switch $S_p$ enables/disables (e.g., connects/disconnects) the current source 14 relative to the array, reset switch $S_{rst}$, and capacitor $C_n$. The current source 14 may be used to provide a pedestal function (i.e., a bias function), for example, to offset-cancel dark currents that are present in the CMOS sensors used in imaging applications. Dark currents refer, for example, to currents that leak through the transistors comprising the CMOS sensors used in imaging applications.

Figure 5:
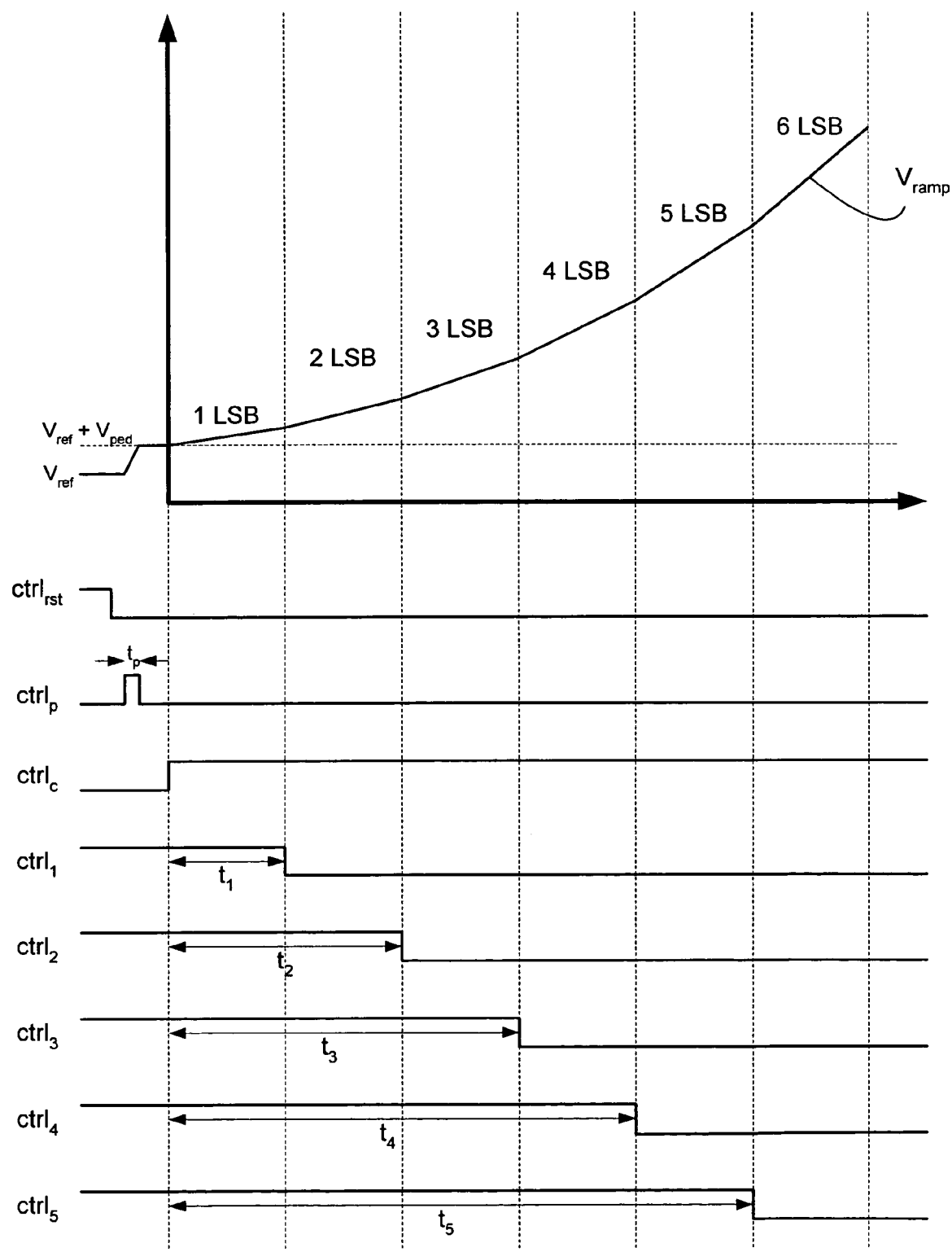
FIG. 5 is a timing diagram for the ramp generator of FIG. 4 according to an alternative embodiment.

FIG. 5 is a timing diagram for the ramp generator 10 of FIG. 4 according to the alternative embodiment. Generally, the ramp generator 10 illustrated in FIG.4 functions in the same manner as the ramp generator 10 discussed above in conjunction with FIG. 2. However, in the alternative embodiment, the current source 14 is enabled for a time period $t_p$ after the reset switch $S_{rst}$ is deactivated, but prior to current source 12 being enabled. Current $I_p$ flows from the current source 14 causing the output of the ramp generator ($V_{ramp}$) to increase from $V_{ref}$ to $V_{ref}+V_{ped}$. It should be apparent to one skilled in the art that the value of $V_{ped}$ is dependent upon $I_p$ and $t_p$. Thus, $V_{ped}$ can easily be controlled to offset any dark currents.

Figure 6:
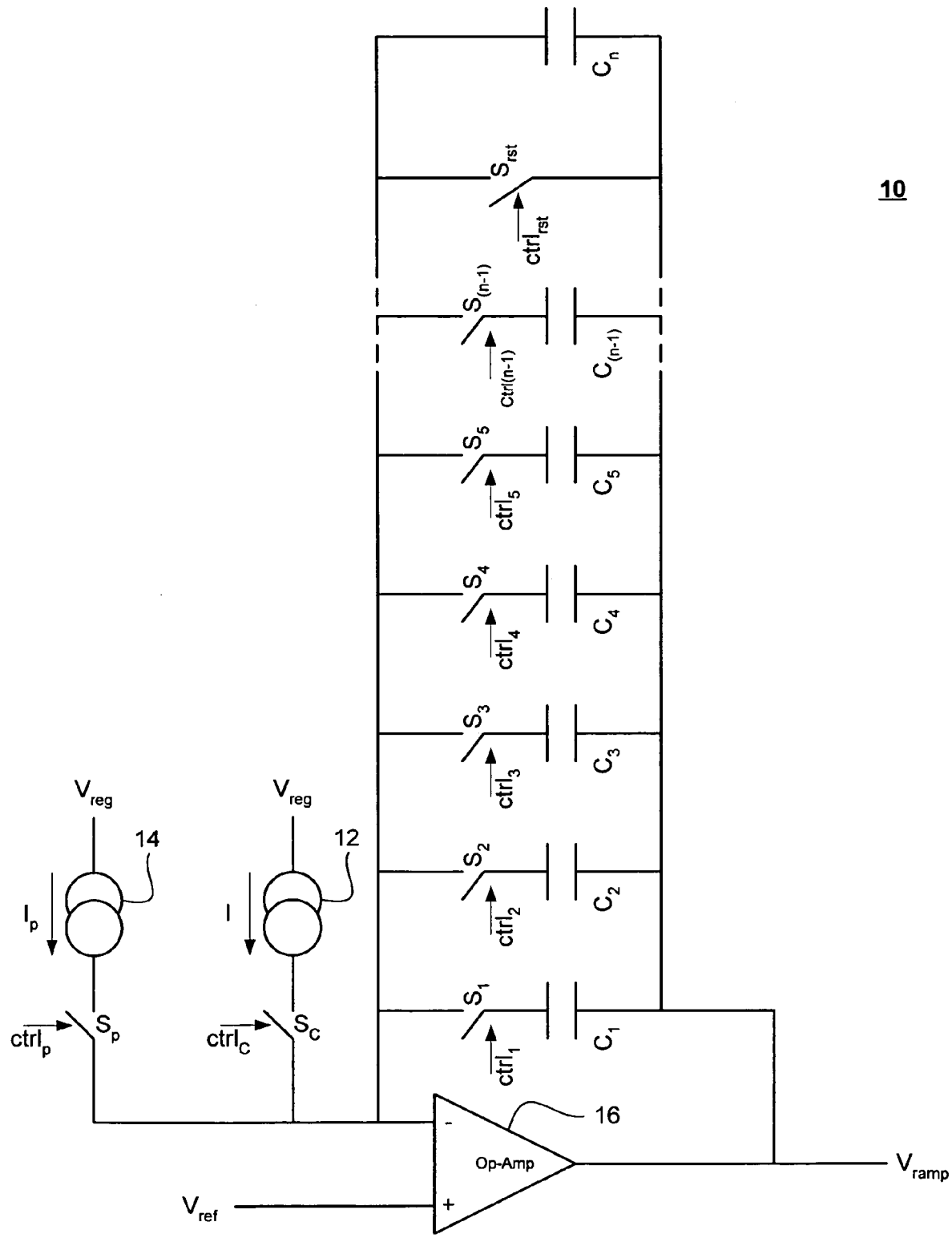
FIG. 6 illustrates a simplified diagram of the ramp generator of FIG. 1 according to another embodiment.

FIG. 6 illustrates a simplified diagram of the ramp generator of FIG. 1 according to another embodiment. As discussed above in conjunction with FIG. 4, the ramp generator 10 of the current embodiment includes an array of capacitors ($C_1, C_2, C_3, \ldots C_{n-1}$) and associated switches ($S_1, S_2, S_3, \ldots S_{n-1}$). Each switch is responsive to a corresponding control signal ($ctrl_1, ctrl_2, ctrl_3, \ldots ctrl_{n-1}$). The ramp generator 10 of the current embodiment also includes a reset switch ($S_{rst}$) responsive to a reset control signal ($crtl_{rst}$), a capacitor $C_n$ (which in the current embodiment does not include a corresponding switch), a current source 12, and a current source 14. The current source 12 includes a corresponding switch ($S_c$) which is responsive to a control signal ($ctrl_c$), whereas the current source 14 includes a corresponding switch ($S_p$) which is responsive to a control signal ($ctrl_p$). The-switches $S_c$ and $S_p$ enable/disable (e.g., connect/disconnect) the current sources 12 and 14, respectively, relative to the capacitor array. Unlike the current sources illustrated in FIGS. 2 and 4 which are illustrated as being supplied using $V_{DD}$, the current sources illustrated in FIG. 6 are supplied by a regulated voltage supply ($V_{reg}$).

Additionally, the ramp generator 10 illustrated in FIG. 6 includes an operational amplifier 16. In the current embodiment, the outputs of the current sources 12, 14, one side of capacitor $C_n$, one side of reset switch $S_{rst}$, and one side of the capacitor array are connected to the negative input terminal of the op-amp 16. The other side of capacitor $C_n$, the other side of reset switch $S_{rst}$, and the other side of the capacitor array are connected to the output of the op-amp 16. A reference voltage ($V_{ref}$) is connected to the positive input terminal of the op-amp 16. The op-amp 16 reduces the loading on the reference input voltage ($V_{ref}$) and provides a constant voltage across, and eliminates voltage dependence of, the current sources 12, 14.

It should be apparent to one skilled in the art that the ramp generator 10 illustrated in FIG. 6 is a single-slope ramp generator. It should further be apparent to one skilled in the art that the polarity of the ramp generator's output (i.e., $V_{ramp}$ rising or falling) depends upon the direction of current flow through the current sources 12, 14. For example, in the configuration illustrated in FIG. 6, the ramp generator's output falls as current flows from $V_{reg}$ through current sources 12, 14.

Figure 7:
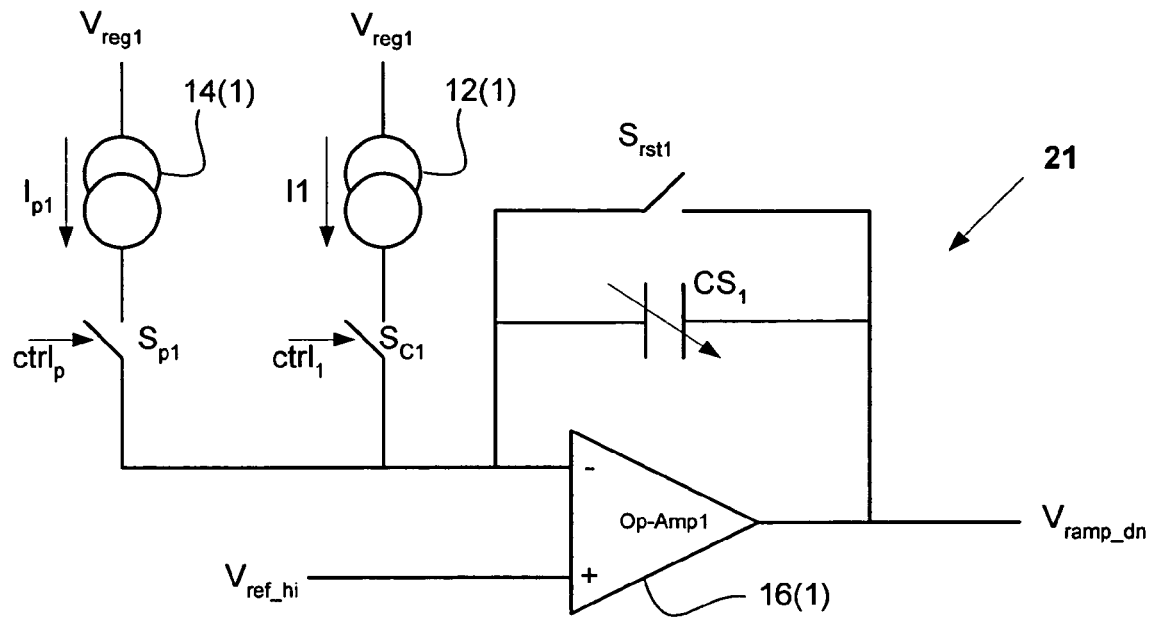
FIG. 7 illustrates a simplified diagram of a ramp generator according to another embodiment.
Figure 7:
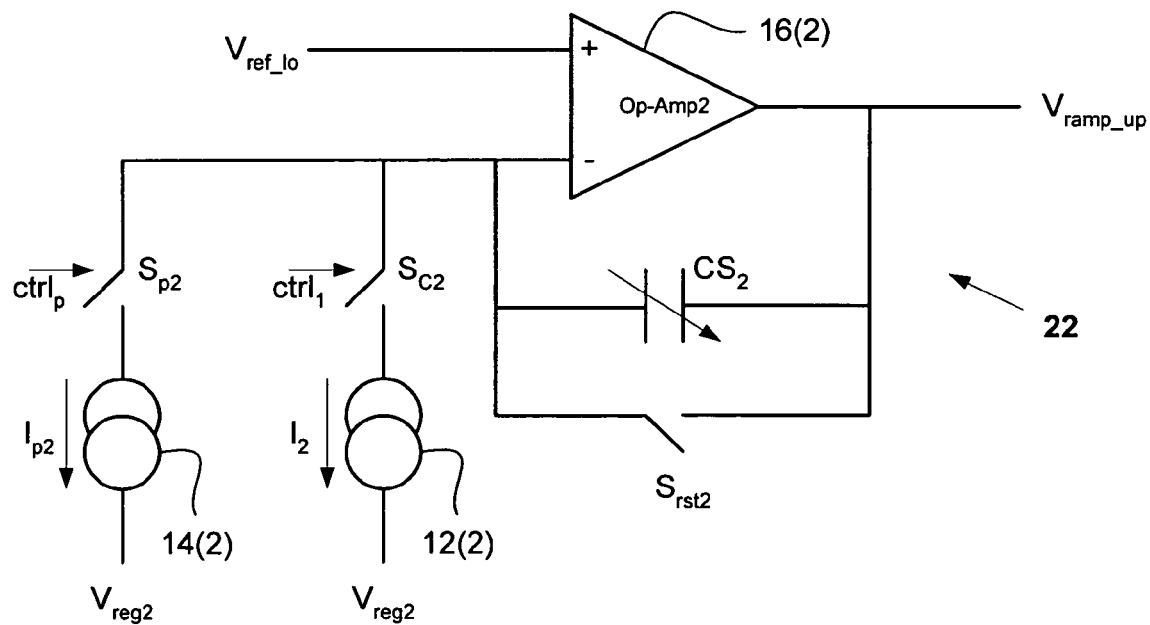

FIG. 7 illustrates a simplified diagram of the ramp generator 20 of FIG. 1 according to another embodiment. The ramp generator 20 may be used, for example, in combination with a digital conversion circuit (such as that illustrated in FIG. 7A) to comprise a differential column-parallel analog to digital converter. The analog-to-digital converter discussed in the current embodiment uses a differential conversion technique to obtain a 12-bit digital code from analog input signal, for example, from a CMOS sensor used in an imaging application.

Referring to FIG. 7, the ramp generator 20 illustrated is a differential output ramp generator operable to produce two separate output voltages (i.e., $V_{ramp\_dn}$ and $V_{ramp\_up}$). In the current embodiment, the ramp generator may be divided into two halves.

The first half, which may be referred to as a falling ramp portion 21, includes an op-amp 16(1), two current sources 12(1), 14(1), a variable capacitor $CS_1$, and a reset switch $S_{rst1}$. In the current embodiment, the outputs of the current sources 12(1), 14(1) and one side of the variable capacitor $CS_1$, and one side of reset switch $S_{rst1}$ are connected to the negative input terminal of the op-amp 16(1). The other side of the variable capacitor $CS_1$ and the other side of the reset switch $S_{rst1}$ are connected to the output of the op-amp 16(1). A reference voltage ($V_{ref\_hi}$) is connected to the positive input terminal of the op-amp 16(1). The falling ramp portion 21 of the ramp generator 20 produces the output signal $V_{ramp\_dn}$.

Initially, reset switch $S_{rst1}$ is closed, thus discharging variable capacitor $CS_1$. At the same time, the ramp output $V_{ramp\_dn}$ is reset to $V_{ref\_hi}$. Reset switch $S_{rst1}$ is then released once the output $V_{ramp\_dn}$ is settled. The current source 14(1) is then activated by closing switch $S_{P1}$ using control signal $Ctrl_P$. The current source 14(1) supplies a current $I_{P1}$ which introduces an offset value at the output $V_{ramp\_n}$ to offset-cancel any dark currents, for example, generated by an input sensor. After switch $S_{P1}$ is opened, the ramping operation begins when current source 12(1) is activated by closing switch $S_{C1}$ using control signal $Ctrl_1$. The current source 12(1) supplies a current $I_1$. The slope of the output ramp is constant up to the point when the variable capacitor $CS_1$ is adjusted at the required break point by switching out a fraction of the capacitor. The ramp output $V_{ramp\_dn}$ can be defined by the following equation:
$V_{ramp\_dn} = V_{ref\_hi} - (I_{P1}*t_P)/CS_1 - (I_1*t_1)/CS_1 - 2I_1*(t_2-t_1)/CS_1 - 3I_1*(t_3-t_2)/CS_1 - \ldots - nI_1*(t_n-t_{n-1})/CS_1$.

It should be noted that the variable capacitor $CS_1$ may be implemented using an array of capacitors, for example, capacitors ($C_{11}, C_{12}, C_{13}, \ldots C_{1n-1}$) and associated switches ($S_{11}, S_{12}, S_{13}, \ldots S_{1n-1}$), each switch responsive to a corresponding control signal ($ctrl_{11}, ctrl_{12}, ctrl_{13}, \ldots ctrl_{1n-1}$). Accordingly, one skilled in the art should recognize that the falling ramp portion 21 of the ramp generator 20 illustrated in FIG. 7 may be constructed and operated in a manner similar to the ramp generator 10 discussed above in conjunction with FIG. 6.

The second half, which may be referred to as a rising ramp portion 22, includes an op-amp 16(2), two current sources 12(2), 14(2), a variable capacitor $CS_2$, and a reset switch $S_{rst2}$. In the current embodiment, the outputs of the current sources 12(2), 14(2), one side of the variable capacitor $CS_2$, and one side of reset switch $S_{rst2}$ are connected to the negative input terminal of the op-amp 16(2). The other side of the variable capacitor $CS_2$ and the other side of reset switch $S_{rst2}$ are connected to the output of the op-amp 16(2). A reference voltage ($V_{ref\_lo}$) is connected to the positive input terminal of the op-amp 16(2). The rising ramp portion 22 of the ramp generator 20 produces the output signal $V_{ramp\_up}$.

Initially, reset switch $S_{rst2}$ is closed, thus discharging variable capacitor $CS_2$. At the same time, the ramp output $V_{ramp\_up}$ is reset to $V_{ref\_lo}$. Reset switch $S_{rst\_2}$ is then released once the output $V_{ramp\_up}$ is settled. The current source 14(2) is then activated by closing switch $S_{P2}$ using control signal $Ctrl_P$. The current source 14(2) supplies a current $I_{P2}$ which introduces an offset value at the output $V_{ramp\_up}$ to offset-cancel any dark current, for example, generated by an input sensor. After switch $SP_2$ is opened, the ramping operation begins when current source 12(2) is activated by closing switch $S_{C2}$ using control-signal $Ctrl_1$. The current source 12(2) supplies a current $I_2$. The slope of the output ramp is constant up to the point when the variable capacitor $CS_2$ is adjusted at the required break point by switching out a fraction of the capacitor. The ramp output $V_{ramp\_up}$ can be defined by the following equation:
$V_{ramp\_up} = V_{ref\_lo} + (I_{P2} * t_P)/CS_2 + (I_2 * t_1)/CS_2 + 2I_2 * (t_2-t_1)/CS_2 + 3I_2 * (t_3-t_2)/CS_2 + \ldots + nI_2 * (t_n-t_{n-1})/CS_2$.

It should be noted that the variable capacitor $CS_2$ may be implemented using an array of capacitors, for example, capacitors ($C_{21}, C_{22}, C_{23}, \ldots C_{2n-1}$) and associated switches ($S_{21}, S_{22}, S_{23}, \ldots S_{2n-1}$), each switch responsive to a corresponding control signal ($ctrl_{21}, ctrl_{22}, ctrl_{23}, \ldots ctrl_{2n-1}$). Accordingly, one skilled in the art should recognize that the rising ramp portion 22 of the ramp generator 20 illustrated in FIG. 7 may be constructed and operated in a manner similar to the ramp generator 10 discussed above in conjunction with FIG. 6, with the exception that for the rising ramp portion 22, the non-inverting input of Op-Amp2 is connected to a low reference voltage (i.e., $V_{ref\_lo}$) and the current sources (i.e., 12(2), 14(2)) are supplied by a sinking regulated supply (i.e., $V_{reg2}$). It should further be noted that the falling ramp portion 21 and the rising ramp portion 22 may be operated individually or simultaneously while remaining within the scope of the present invention.

Figure 7A:
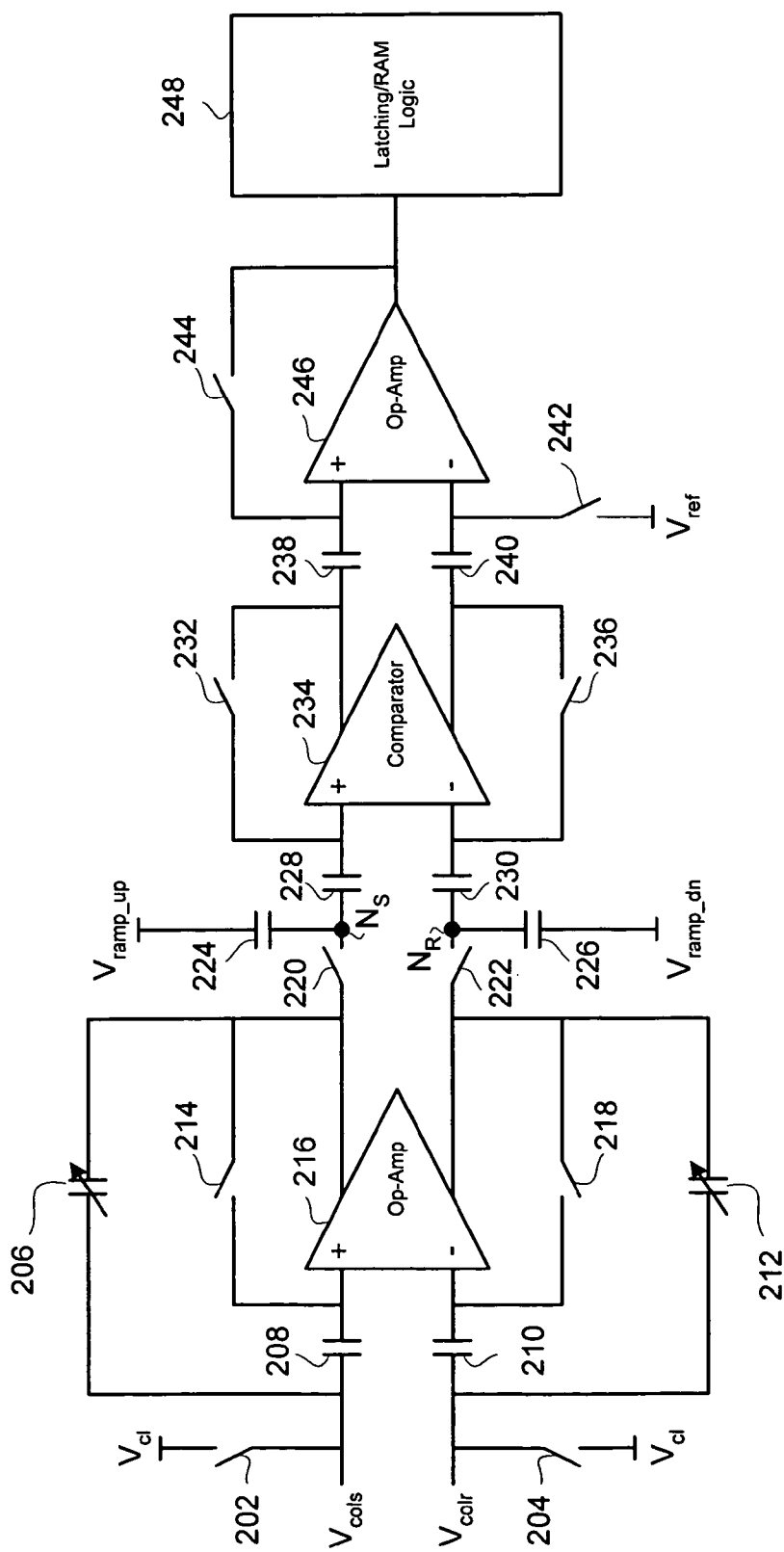
FIG. 7A illustrates a simplified diagram of a digital conversion circuit according to one embodiment.
Figure 8:
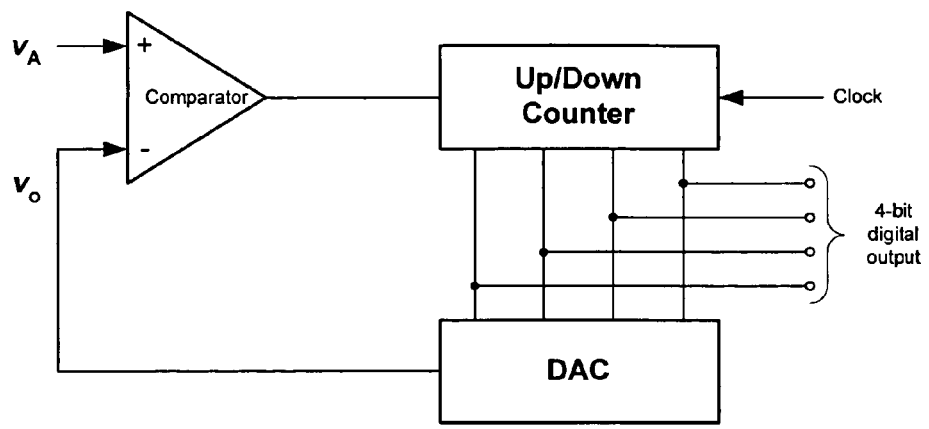
FIG. 8 is a simplified diagram of a feedback-type analog-to-digital converter according to the prior art.
Figure 9:
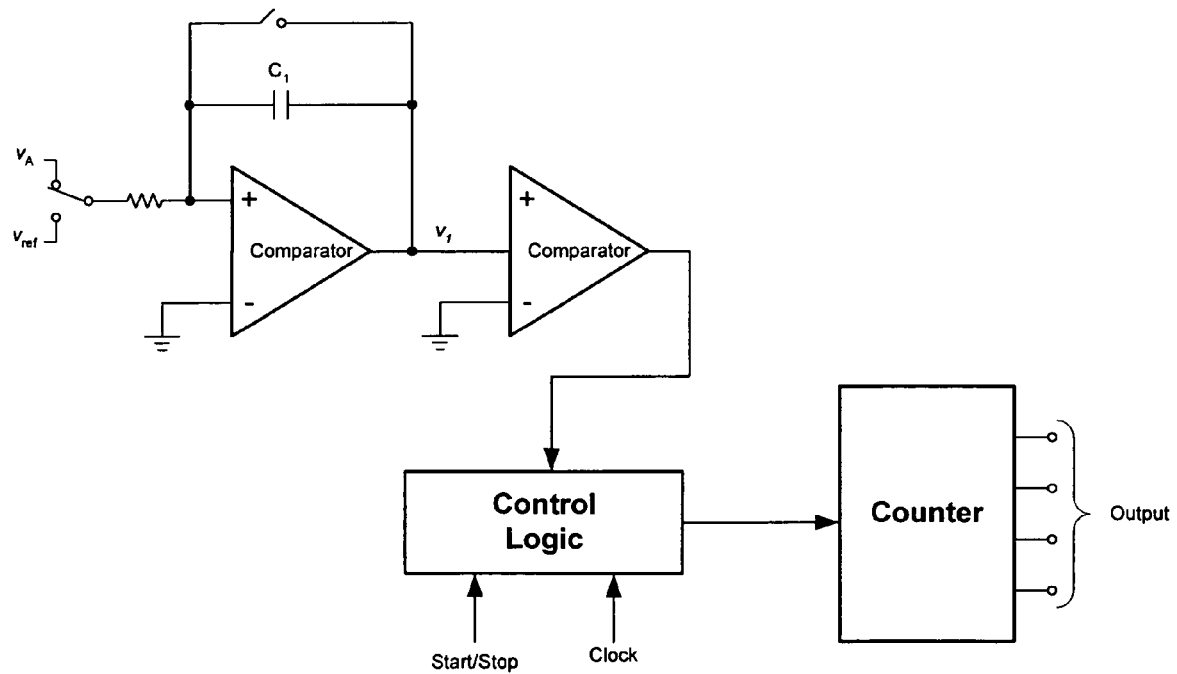
FIG. 9 is a simplified diagram of a dual-slope analog-to-digital converter according to the prior art.
Figure 10:
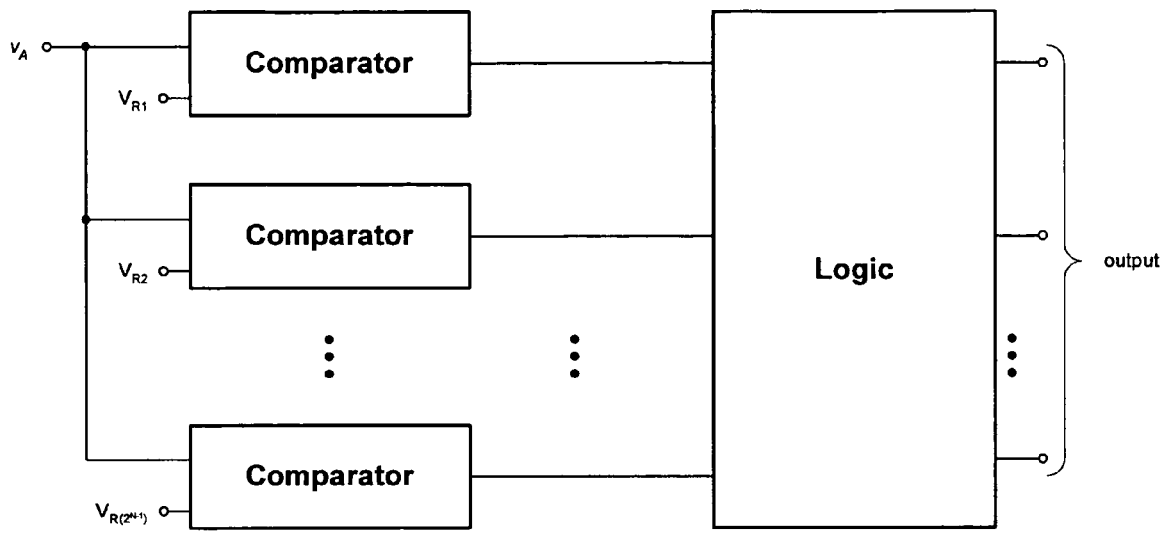
FIG. 10 is a simplified diagram of a flash analog-to-digital converter according to the prior art.
Figure 11:
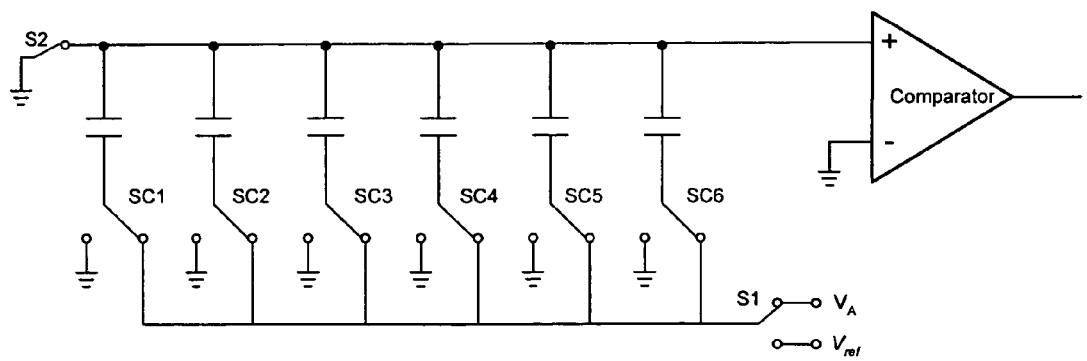
FIG. 11 is a simplified diagram of a charge-redistribution analog-to-digital converter according to the prior art.

Referring now to FIG. 7A, the differential conversion circuit 200 receives the output signals $V_{ramp\_up}$ and $V_{ramp\_dn}$ from the differential ramp generator 20 illustrated in FIG. 7. The conversion circuit 200 includes a differential amplifier 216, a two-stage AC-coupled comparator comprised of a differential comparator 234 and a second amplifier 246, latching/RAM logic 248, switches 202, 204, 214, 218, 220, 222, 232, 236, 242, 244, capacitors 208, 210, 224, 226, 228, 230, 238, 240 and variable capacitors 206, 212.

Operation of the differential column-parallel ADC is generally as follows. Analog signals $V_{colr}$ and $V_{cols}$ (e.g., from a CMOS image sensor) are input to the differential amplifier 216. The difference between $V_{colr}$ and $V_{cols}$ is amplified by the differential amplifier 216. This amplified differential signal is stored between nodes Nr and Ns. Simultaneously, the two-stage AC-coupled comparator 234, 246 is primed for action by biasing the inputs and outputs at $\sim V_{DD}/2$ and $V_{ref}$. This biasing is accomplished using switches 232, 236, and 244. During the analog-to-digital conversion, the amplified differential signal stored at nodes Nr and Ns is compared to the outputs from the differential ramp generator (i.e., $V_{ramp\_dn}$ and $V_{ramp\_up}$). The latching/RAM logic 248 generates a 12-bit code in response to the output of the two-stage AC-coupled comparator. In the current embodiment, for example, the latching/RAM logic 248 generates a 12-bit code if the differential ramp signal is greater than the amplified differential signal.

It should be apparent to those of ordinary skill in the art that equivalent logic or physical circuits may be constructed using alternate logic elements while remaining within the scope of the present invention. It should further be recognized that the above-described embodiments of the invention are intended to be illustrative only. Numerous alternative embodiments may be devised by those skilled in the art without departing from the scope of the following claims.

What is claimed is:

1. A ramp generator for an analog-to-digital converter, comprising:
   control logic configured for producing a plurality of control signals during the production of a ramp signal comprised of a plurality of discrete segments;
   said control logic being further configured for changing the state of one or more of said plurality of control signals during the production of said ramp signal;
   an array of parallel connected capacitors each controlled by a switch operable to connect/disconnect that switch's capacitor to/from said other capacitors within said array, wherein each of said switches is responsive to one or more of said plurality of control signals; and
   a current source for charging at least one of said capacitors within said array.

2. The ramp generator of claim 1 further comprising a reset switch and a non-switchable capacitance.

3. The ramp generator of claim 1 further comprising a current source switch operable to disable said current source relative to said array.

4. The ramp generator of claim 1 wherein said capacitors are matched.

5. The ramp generator of claim 3 further comprising:
   another current source for providing a bias function; and
   another current source switch operable to disable said another current source relative to said array.

6. The ramp generator of claim 5 further comprising an operational amplifier, said operational amplifier having:
   a first input for receiving a reference voltage;
   a second input connected to an output of said current source, an output of said another current source, and a first side of said array; and
   an output connected to a second side of said array.

7. The ramp generator of claim 6 wherein said current source and said another current source are supplied by a regulated voltage.

8. The ramp generator of claim 1 wherein the ramp generator is operable to produce a ramp signal having a linear portion and wherein each of said plurality of discrete segments is defined by one or more programmable breakpoints implemented through said plurality of control signals.

9. A ramp generator, comprising:
   control logic for generating a plurality of control signals during the production of one of a rising edge or a falling edge of a ramp signal;
   a falling ramp portion, wherein said falling ramp portion comprises a first operational amplifier comprising:
   a first input for receiving a high reference voltage; and
   second input connected to a first current source and a first side of a first variable capacitance, said first variable capacitance being responsive to said control logic; and
   an output connected to a second side of said first capacitance; and
   a rising ramp portion, wherein said rising ramp portion comprises a second operational amplifier comprising:

a first input for receiving a low reference voltage;
a second input connected to a second current source and a first side of a second variable capacitance, said second variable capacitance being responsive to said control logic; and
an output connected to a second side of said second capacitance.

10. The ramp generator of claim 9 wherein said falling ramp portion additionally comprises a first bias current source connected to said second input of said first operational amplifier, and wherein said raising ramp portion additionally comprises a second bias current source connected to said second input of said second operational amplifier.

11. The ramp generator of claim 9 wherein said first variable capacitance comprises at least one of a first variable capacitor or a first array of capacitors, and wherein each capacitor is controlled by a switch and wherein said second variable capacitance comprises at least one of a second variable capacitor or a second array of capacitors, and wherein each capacitor is controlled by a switch.

12. The ramp generator of claim 11 wherein each of said switches for said first array is operable to connect/disconnect one or more of said capacitors within said first array, each of said switches responsive to one or more control signals.

13. The ramp generator of claim 11 wherein each of said switches for said second array is operable to connect/disconnect one or more of said capacitors within said second array, each of said switches responsive to one or more control signals.

14. The ramp generator of claim 10 wherein at least one of said first current source, said first bias current source, said second current source, and said second bias current source are supplied by a regulated voltage.

15. The ramp generator of claim 11 wherein said plurality of capacitors within said first array are matched.

16. The ramp generator of claim 11 wherein said plurality of capacitors within said second array are matched.

17. A method for operating a ramp generator having an array of capacitors each controlled by a switch, comprising:
resetting said ramp generator;
generating a plurality of control signals during the production of a ramp signal comprised of a plurality of discrete segments;
enabling a current generator, said current generator charging connected capacitors within said array;
controlling the state of one or more switches with said control signals, wherein said switches are operable to control which of said capacitors are connected in parallel within said array; and
changing the state of one or more of said plurality of control signals during the production of said ramp signal.

18. The method of claim 17 wherein said resetting said ramp generator comprises:
disabling said current generator; and
controlling the state of a reset switch, said reset switch operable to connect the output of said ramp generator to a reference voltage.

19. The method of claim 17 wherein said resetting said ramp generator comprises:
disabling said current generator;
connecting the output of said ramp generator to a reference voltage;
disconnecting the output of said ramp generator from said reference voltage; and enabling a second current generator for a predetermined period, said second current generator charging at least one capacitor in said array.

20. An analog-to-digital converter, comprising:
a ramp generator for producing a ramp signal output wherein said ramp signal output has a linear portion and a portion comprised of a plurality of discrete segments;
said ramp generator comprising:
control logic configured for producing a plurality of control signals during the production of said ramp signal output;
said control logic being further configured for changing the state of one or more of said plurality of control signals during the production of said ramp signal;
an array of parallel connected capacitors each controlled by a switch operable to connect/disconnect that switch's capacitor to/from said other capacitors within said array, wherein said switches are responsive to one or more of said plurality of control signals; and
a current source for charging at least one of said capacitors within said array; and
a comparator producing a comparator output responsive to an analog input and said ramp signal output.

21. The analog-to-digital converter of claim 20 wherein said array includes a reset switch and a non-switchable capacitance.

22. The analog-to-digital converter of claim 20 wherein said ramp generator further comprises a current source switch operable to disable said current source relative to said array.

23. The analog-to-digital converter of claim 22 wherein said ramp generator further comprises:
another current source for providing a bias function; and
another current source switch operable to disable said another current source relative to said array.

24. The analog-to-digital converter of claim 23 wherein said ramp generator further comprises an operational amplifier, said operational amplifier having:
a first input for receiving a reference voltage;
a second input connected to an output of said current source, an output of said another current source, and a first side of said array; and
an output connected to a second side of said array.

25. The analog-to-digital converter of claim 24 wherein said current source and said another current source are supplied by a regulated voltage.

26. The analog-to-digital converter of claim 20 wherein said capacitors within said ramp generator are matched.

27. The analog-to-digital converter of claim 20, each of said plurality of discrete segments being defined by one or more programmable breakpoints implemented through said plurality of control signals.

28. An analog-to-digital converter, comprising:
control logic for generating a plurality of control signals during the production of one of a rising edge or a falling edge a ramp signal;
a ramp generator, comprising:
a falling ramp portion operable to produce a falling ramp signal, wherein said falling ramp portion comprises a first operational amplifier comprising:
a first input for receiving a high reference voltage; and a second input connected to a first current source and a first side of a first variable capacitance, said first variable capacitance being responsive to said control logic; and an output connected to a second side of said first capacitance; and a rising ramp portion operable to produce a rising ramp signal, wherein said rising ramp portion comprises a second operational amplifier comprising:

a first input for receiving a low reference voltage;

a second input connected to a second current source and a first side of a second variable capacitance, said second variable capacitance being responsive to said control logic; and an output connected to a second side of said second capacitance; and a conversion circuit, comprising:

a differential amplifier operable to produce an amplified differential signal responsive to two or more input signals;

a comparator operable to compare said amplified differential signal to the difference of said falling ramp signal and said rising ramp signal; and a logic circuit operable to produce a digital output responsive to an output of said comparator.

29. The ramp generator of claim 28 wherein said falling ramp portion additionally comprises a first bias current source connected to said second input of said first operational amplifier, and wherein said raising ramp portion additionally comprises a second bias current source connected to said second input of said second operational amplifier.

30. The converter of claim 29 wherein at least one of said first current source, said first bias current source, said second current source, and said second bias current source are supplied by a regulated voltage.

31. The converter of claim 28 wherein said first variable capacitance comprises at least one of a first variable capacitor or a first array of capacitors, and wherein each capacitor is controlled by a switch, and wherein said second variable capacitance comprises at least one of a second variable capacitor or a second array of capacitors, and wherein each capacitor is controlled by a switch.

32. The converter of claim 31 wherein each of said switches for said first array is operable to connect/disconnect one or more of a said capacitors within said first array, each of said switches responsive to one or more control signals.

33. The converter of claim 31 wherein each of said switches for said second array is operable to connect/disconnect one or more of said capacitors within said second array, each of said switches responsive to one or more control signals.

34. The converter of claim 31 wherein said plurality of capacitors within said first array are matched.

35. The converter of claim 31 wherein said plurality of capacitors within said second array are matched.

36. The converter of claim 28 wherein said comparator is a two-stage AC coupled comparator comprising a differential comparator and an operational amplifier.

37. The converter of claim 28 wherein said logic produces a digital output if the difference of said falling ramp signal and said rising ramp signal is greater than said amplified differential signal.

38. A nonlinear, programmable ramp generator, comprising:

control logic configured for generating a plurality of control signals during the production of a ramp signal, having a linear portion and a compressed portion;

said control logic being further configured for changing the state of one or more of said plurality of control signals during the production of said ramp signal;

said control signals representing programmable points at which the slope of the ramp signal changes;

a variable capacitance responsive to said plurality of control signals; and a current source for charging said variable capacitance.

39. The ramp generator of claim 38 wherein said variable capacitance is provided by either a plurality of parallel connected capacitors or a variable capacitor.

40. The ramp generator of claim 38 additionally comprising a second current source to provide a bias voltage to said variable capacitance.

41. A method of operating a nonlinear, programmable ramp generator, comprising:

generating a plurality of control signals during the production of a ramp signal having a linear portion and a compressed portion;

said control signals representing programmable points at which the slope of the ramp signal changes;

controlling the capacitance of a variable capacitance in response to said plurality of control signals;

changing the state of one or more of said plurality of control signals during the production of said ramp signal; and charging said variable capacitance.

42. The method of claim 41 wherein said controlling the capacitance includes controlling the capacitance of either a plurality of parallel connected capacitors or a variable capacitor.

43. The method of claim 41 additionally comprising providing a bias voltage to said variable capacitance.

* * * * *

UNITED STATES PATENT AND TRADEMARK OFFICE
CERTIFICATE OF CORRECTION

PATENT NO. : 7,230,561 B2  
APPLICATION NO. : 11/044532  
DATED : June 12, 2007  
INVENTOR(S) : Yan Lee It is certified that error appears in the above-identified patent and that said Letters Patent is hereby corrected as shown below:

Column 4, Line 5, after "to" delete --a--.

Column 6, Lines 53 - 54, delete "corresponding-switch" and substitute therefore --corresponding switch--.

Column 7, Line 43, delete "The-switches" and substitute therefore --The switches--.

Column 8, Line 39, delete " $V_{ramp\_n}$ " and substitute therefore -- $V_{ramp\_d\ n}$ --.

Column 9, Line 9, delete " $S_{rst\ 2}$ " and substitute therefore -- $S_{rst2}$ --.

Column 9, Line 17, delete "control-signal" and substitute therefore --control signal--.

Column 12, Line 60, after "edge" insert --of--.

Signed and Sealed this

Sixteenth Day of October, 2007

JON W. DUDAS  
*Director of the United States Patent and Trademark Office*